US011784170B2

(12) United States Patent
Ishii et al.

(10) Patent No.: US 11,784,170 B2
(45) Date of Patent: Oct. 10, 2023

(54) LIGHT-EMITTING DEVICE AND LIGHT-EMITTING MODULE WITH FRAME AND COVERING MEMBER

(71) Applicant: NICHIA CORPORATION, Anan (JP)

(72) Inventors: Takashi Ishii, Tokushima (JP); Dai Wakamatsu, Komatsushima (JP); Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/826,160

(22) Filed: May 27, 2022

(65) Prior Publication Data
US 2022/0293573 A1    Sep. 15, 2022

Related U.S. Application Data

(63) Continuation of application No. 17/024,704, filed on Sep. 18, 2020, now Pat. No. 11,380,659.

(30) Foreign Application Priority Data

Sep. 24, 2019  (JP) .................................. 2019-172787

(51) Int. Cl.
*H01L 23/48*  (2006.01)
*H01L 25/075*  (2006.01)
(Continued)

(52) U.S. Cl.
CPC ........ *H01L 25/0753* (2013.01); *H01L 25/162* (2013.01); *H01L 25/167* (2013.01);
(Continued)

(58) Field of Classification Search
CPC ... H01L 25/167; H01L 25/0753; H01L 33/62; H01L 33/52; H01L 2933/0033;
(Continued)

(56) References Cited

U.S. PATENT DOCUMENTS 6,271,469 B1    8/2001  Ma et al.
2007/0099341 A1  5/2007  Lo
(Continued)

FOREIGN PATENT DOCUMENTS

JP     10-116929      5/1998
JP     2004-273897    9/2004
(Continued)

OTHER PUBLICATIONS

Office Action with Form PTO-892 Notice of References Cited issued by the U.S. Patent and Trademark Office for the parent U.S. Appl. No. 17/024,704, filed Dec. 2, 2021.

*Primary Examiner* — Ismail A Muse
(74) *Attorney, Agent, or Firm* — MORI & WARD, LLP

(57) ABSTRACT

A light emitting device that includes a plurality of element structures, a frame, and a covering member. Each of the plurality of element structures includes a light emitting element. The frame surrounds the plurality of element structures. The covering member is disposed on an inner side of the frame. The covering member is disposed between the frame and an element structure of the plurality of element structures adjacent to the frame and between adjacent element structures of the plurality of element structures. An upper surface and a lower surface of each of the plurality of element structures are exposed from the covering member.

20 Claims, 13 Drawing Sheets

(51) Int. Cl.
  *H01L 33/62* (2010.01)
  *H01L 33/60* (2010.01)
  *H01L 25/16* (2023.01)
  *H01L 33/56* (2010.01)

(52) U.S. Cl.
  CPC .............. *H01L 33/60* (2013.01); *H01L 33/62* (2013.01); *H01L 33/56* (2013.01); *H01L 2933/0058* (2013.01); *H01L 2933/0066* (2013.01)

(58) Field of Classification Search
  CPC .............. H01L 23/49838; H01L 25/50; H01L 27/1214; H01L 33/36; H01L 33/54
  See application file for complete search history.

(56) References Cited

U.S. PATENT DOCUMENTS

| | | | |
|---|---|---|---|
| 2009/0166657 | A1 | 7/2009 | Yamada et al. |
| 2012/0007112 | A1 | 1/2012 | Yamada et al. |
| 2012/0302124 | A1* | 11/2012 | Imazu .................. H01L 33/486 445/58 |
| 2013/0033169 | A1 | 2/2013 | Ito et al. |
| 2013/0188381 | A1* | 7/2013 | Kotani .................... H01L 33/54 362/520 |
| 2013/0329440 | A1* | 12/2013 | Tsutsumi ............... B60Q 1/143 362/465 |
| 2014/0203306 | A1* | 7/2014 | Ito ........................... H01L 33/60 257/98 |
| 2015/0179891 | A1 | 6/2015 | Yamada et al. |
| 2015/0380622 | A1* | 12/2015 | Miyoshi ................. H01L 33/58 438/27 |
| 2016/0190380 | A1 | 6/2016 | Luan |
| 2017/0018697 | A1* | 1/2017 | Konishi ............. H01L 25/0753 |
| 2017/0062663 | A1 | 3/2017 | Hayashi |
| 2017/0179360 | A1 | 6/2017 | Miyoshi et al. |
| 2018/0040776 | A1 | 2/2018 | Yamada et al. |
| 2018/0145229 | A1 | 5/2018 | Hayashi |
| 2018/0244963 | A1 | 8/2018 | Takano et al. |
| 2020/0052160 | A1* | 2/2020 | Li ......................... H01L 25/167 |
| 2020/0144327 | A1 | 5/2020 | Lee et al. |
| 2020/0152839 | A1 | 5/2020 | Hayashi |
| 2020/0182424 | A1* | 6/2020 | Yuge ..................... F21S 41/153 |
| 2021/0317958 | A1* | 10/2021 | Kageyama ................ F21K 9/90 |
| 2022/0260228 | A1* | 8/2022 | Thaliath .................. F21S 43/14 |

FOREIGN PATENT DOCUMENTS

| | | |
|---|---|---|
| JP | 2006-165058 | 6/2006 |
| JP | 2007-088453 | 4/2007 |
| JP | 2007-329372 | 12/2007 |
| JP | 2009-182307 | 8/2009 |
| JP | 2010-010252 | 1/2010 |
| JP | 2010-177225 | 8/2010 |
| JP | 2012-199342 | 10/2012 |
| JP | 2013-038187 | 2/2013 |
| JP | 2016-27620 | 2/2016 |
| JP | 2017-050366 | 3/2017 |
| JP | 2017-079325 | 4/2017 |
| JP | 2018-041858 | 3/2018 |
| WO | WO 2017/038913 | 3/2017 |
| WO | WO 2018/158857 | 9/2018 |
| WO | WO 2018/158858 | 9/2018 |

* cited by examiner

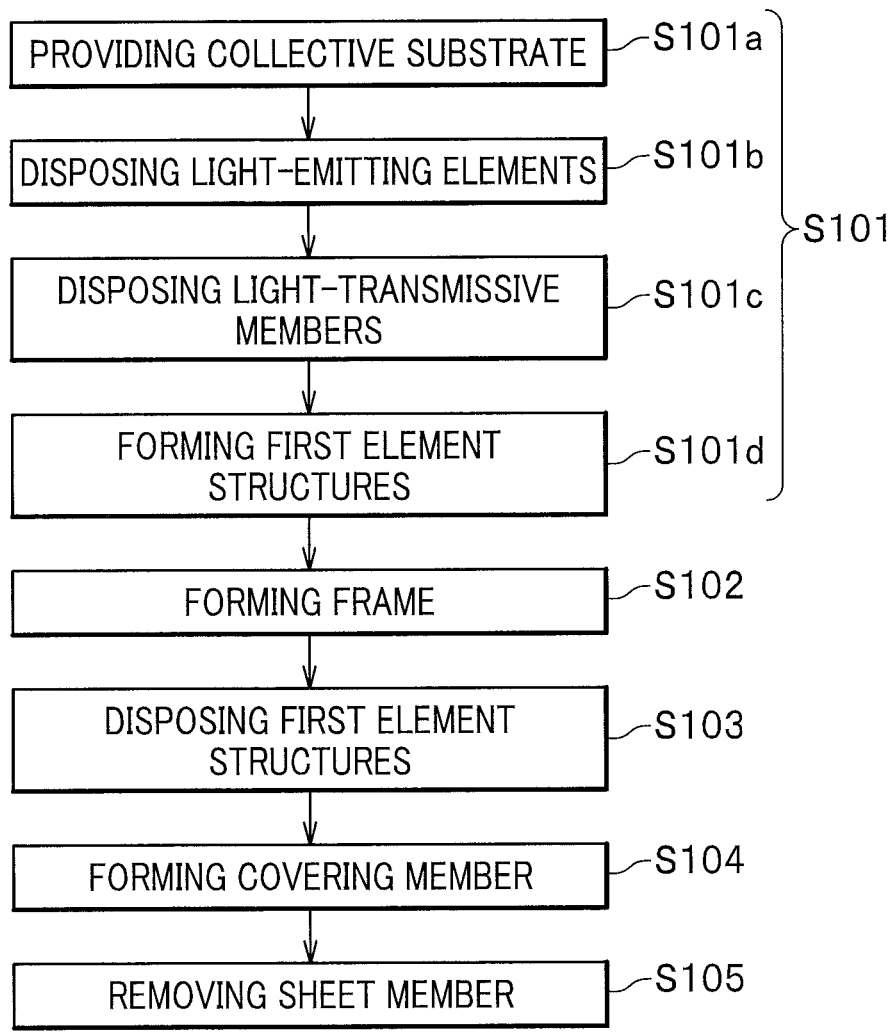
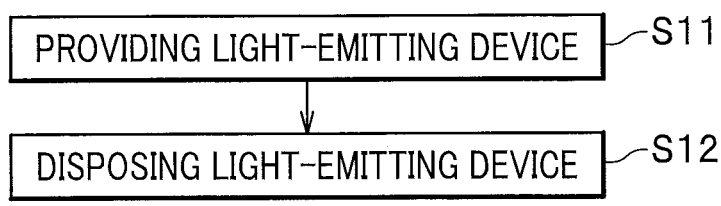

LIGHT-EMITTING DEVICE AND LIGHT-EMITTING MODULE WITH FRAME
AND COVERING MEMBER

CROSS-REFERENCE TO RELATED APPLICATIONS

The present application is a continuation application of U.S. patent application Ser. No. 17/024,704, filed Sep. 18, 2020, which claims priority under 35 U.S.C. § 119 to Japanese Patent Application No. 2019-172787, filed Sep. 24, 2019, the contents of which are incorporated herein by reference in their entirety.

BACKGROUND OF THE INVENTION

1. Field of the Invention

The present disclosure relates to a method of manufacturing a light-emitting device and a method of manufacturing a light-emitting module.

2. Description of Related Art

A light-emitting device having a plurality of light-emitting surfaces has been known. For example, Japanese Unexamined Patent Application Publication No. 2016-27620 describes a light-emitting device that includes a plurality of light-emitting elements, a light-transmissive member that covers upper surfaces of the light-emitting elements, and a light-reflective member that integrally covers lateral surfaces of the light-emitting elements.

SUMMARY OF THE INVENTION

To densely dispose a plurality of light-emitting surfaces, the structure of such a light-emitting device has room for further improvement. Certain embodiments according to the present disclosure advantageously provide a method of manufacturing a light-emitting device that has small intervals between adjacent ones of the light-emitting surfaces and a method of manufacturing a light-emitting module.

A method of manufacturing a light-emitting device according to one embodiment of the present disclosure includes: providing a plurality of element structures, each of which includes a submount substrate, a light-emitting element, and a light-transmissive member in this order; disposing the plurality of element structures such that the light-transmissive members face a sheet member; and forming a covering member on the sheet member to cover at least a portion of each of lateral surfaces of the submount substrate of each of the element structures.

A method of manufacturing a light-emitting module according to another embodiment of the present disclosure includes providing a light-emitting device using the method of manufacturing the light-emitting device, and disposing the light-emitting device such that the submount substrates face a module substrate.

A method of manufacturing a light-emitting device according to certain embodiments of the present disclosure allows for manufacturing a light-emitting device that has small intervals between adjacent ones of the light-emitting surfaces. A method of manufacturing a light-emitting module according to certain embodiments of the present disclosure allows for manufacturing a light-emitting module that has small intervals between adjacent ones of the light-emitting surfaces can be manufactured by.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a flowchart illustrating a method of manufacturing the light-emitting device according to the first embodiment.

FIG. 3 is a flowchart illustrating a method of manufacturing the light-emitting module according to the first embodiment.

DETAILED DESCRIPTION OF EMBODIMENTS

Figure 1A:
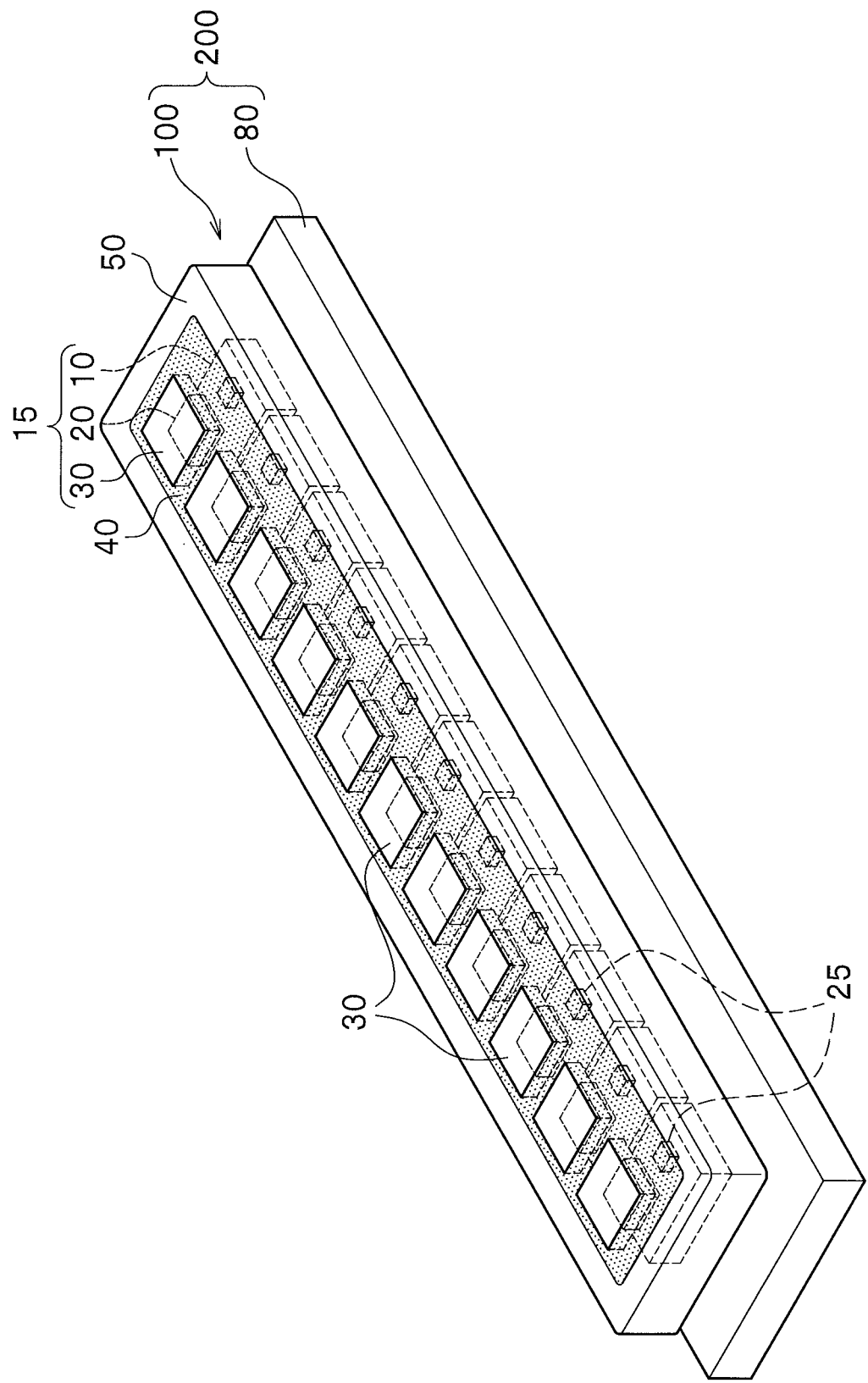
FIG. 1A is a perspective view schematically illustrating the structure of a light-emitting module including a light-emitting device according to a first embodiment.

Certain embodiments of the present disclosure are described below with reference to the drawings. The embodiments described below are examples of a method of manufacturing a light-emitting device, a method of manufacturing a light-emitting module, a light-emitting device, and a light-emitting module for giving a concrete form to the technical ideas of the present invention, but the present invention is not limited to the embodiments described below. Unless specifically stated otherwise, the sizes, materials, shapes, and relative positions of constituent components described in the embodiments described below are not intended to limit the scope of the present invention, but are rather merely examples. Sizes or positional relationships of members illustrated in the drawings may be exaggerated in order to clarify the descriptions. The number of the light-emitting elements illustrated in each drawing is an example to facilitate understanding of the structure.

First Embodiment

Figure 1B:
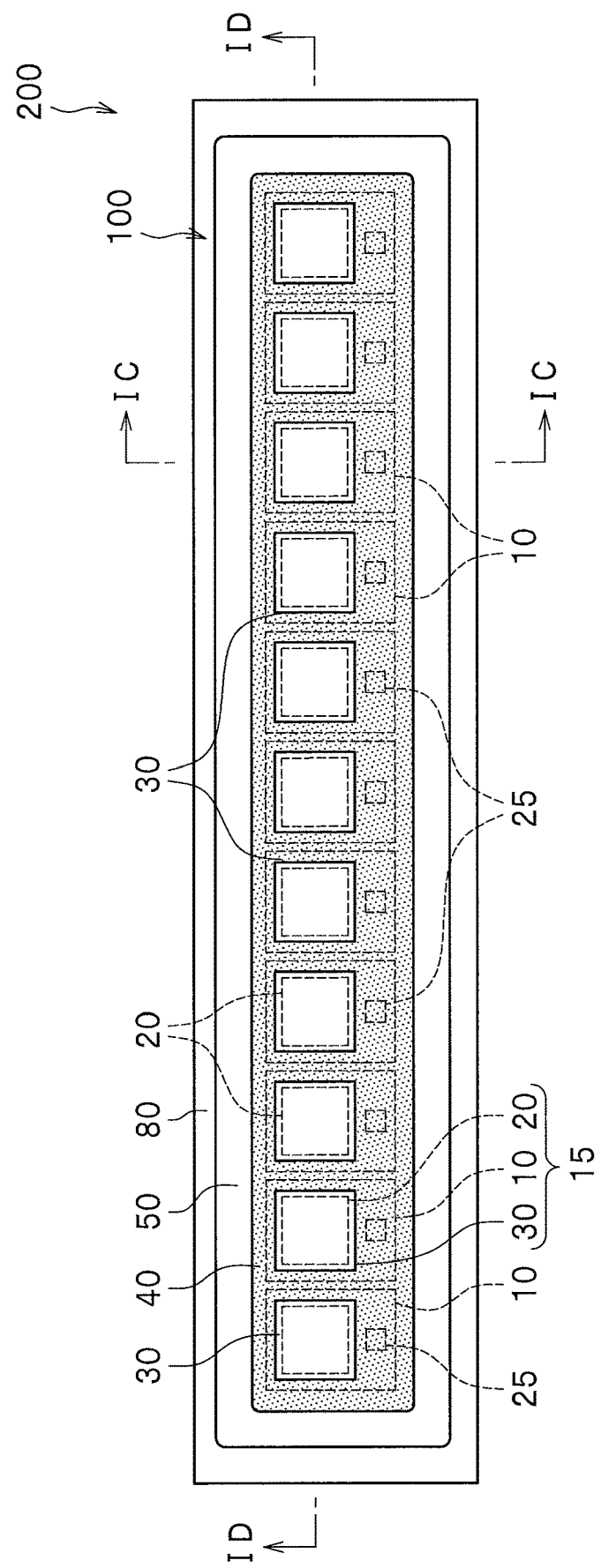
FIG. 1B is a plan view schematically illustrating the structure of the light-emitting module including the light-emitting device according to the first embodiment.
Figure 1C:
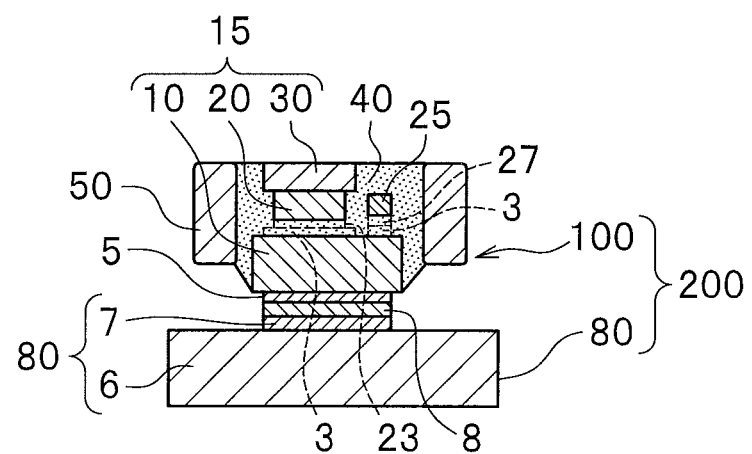
FIG. 1C is a schematic cross-sectional view taken along line IC-IC of FIG. 1B.
Figure 1D:
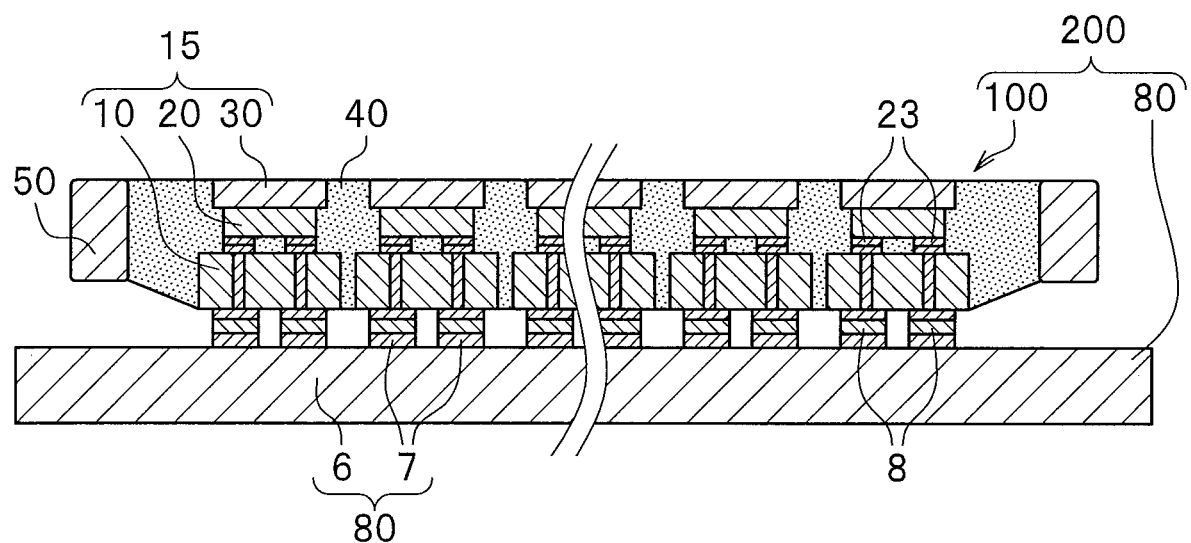
FIG. 1D is a schematic cross-sectional view taken along line ID-ID of FIG. 1B.
Figure 1E:
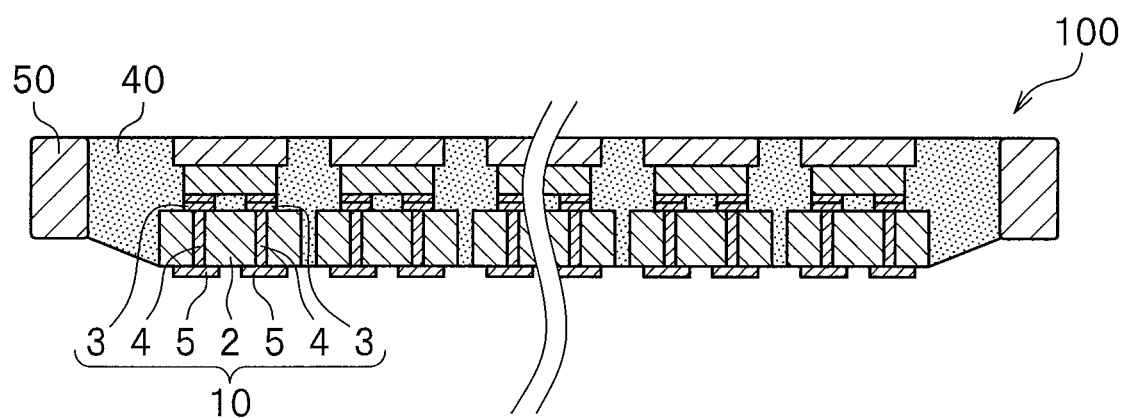
FIG. 1E is a cross-sectional view schematically illustrating the structure of the light-emitting device according to the first embodiment.
Figure 1F:
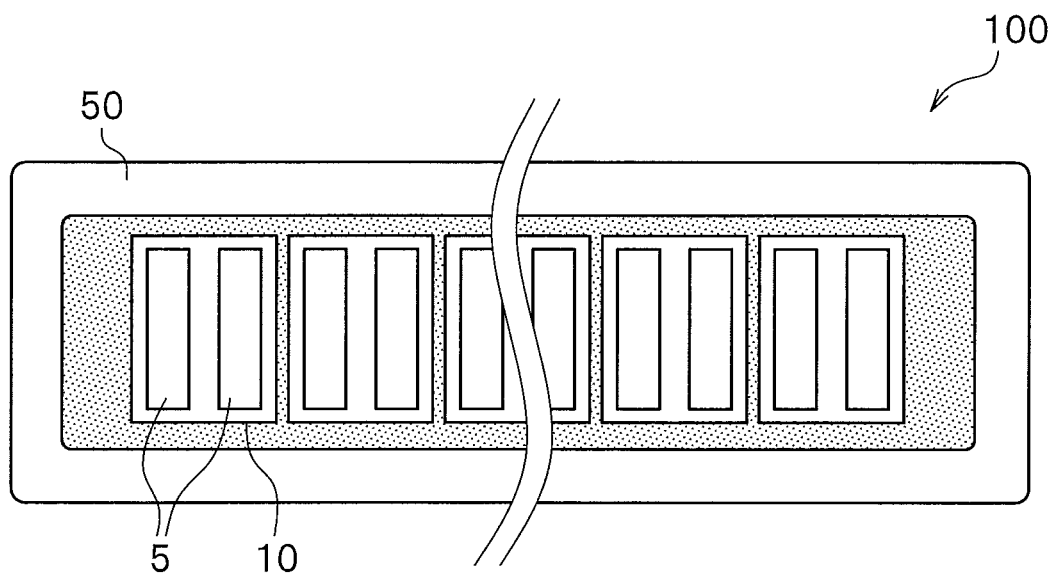
FIG. 1F is a bottom view schematically illustrating the structure of the light-emitting device according to the first embodiment.

FIG. 1A is a perspective view schematically illustrating the structure of a light-emitting module including a light-emitting device according to a first embodiment. FIG. 1B is a plan view schematically illustrating the structure of the light-emitting module including the light-emitting device according to the first embodiment. FIG. 1C is a schematic cross-sectional view taken along line IC-IC of FIG. 1B. FIG. 1D is a schematic cross-sectional view taken along line ID-ID of FIG. 1B. FIG. 1E is a cross-sectional view schematically illustrating the structure of the light-emitting device according to the first embodiment. FIG. 1F is a bottom view schematically illustrating the structure of the light-emitting device according to the first embodiment.

A light-emitting module 200 includes a light-emitting device 100 and a module substrate 80. The light-emitting device 100 is disposed on the module substrate 80.

Light-Emitting Device

The light-emitting device 100 will be described below.

The light-emitting device 100 includes a plurality of element structures 15 each of which includes a submount substrate 10, a light-emitting element 20, and a light-transmissive member 30 that are layered in this order (hereinafter referred to as first element structures 15 as appropriate) and a covering member 40 that covers lateral surfaces of each of the first element structures 15 to hold the first element structures 15.

The light-emitting device 100 mainly includes the submount substrates 10, the light-emitting elements 20, protective elements 25, the light-transmissive members 30, the covering member 40, and a frame 50.

Configurations of the light-emitting device 100 will be described below.

The light-emitting element 20 and the protective element 25 are disposed on the submount substrate 10. The submount substrate 10 has, for example, a substantially elongated-rectangular shape in a plan view. The submount substrate 10 includes a base portion 2 and wirings to electrically connect the light-emitting device 100 to external components. More specifically, the submount substrate 10 includes the base portion 2, and the wirings that are disposed in the base portion 2. The wirings include first wiring portions 3, inner wiring portions 4, and second wiring portions 5.

A preferable material for the base portion 2 includes an insulating material that is unlikely to transmit light such as light emitted from the light-emitting element 20 and external light. For example, ceramics such as alumina, aluminum nitride, and mullite, thermoplastic resins such as polyamides (PA), polyphthalamide (PPA), polyphenylene sulfide (PPS), and liquid crystal polymers, and other resins such as epoxy resins, silicone resins, modified epoxy resins, urethane resins, and phenolic resins can be used. Among these materials, ceramics having high heat dissipation performance and are preferably used.

In the light-emitting device 100, the distance between adjacent ones of the submount substrates 10 is preferably 0.05 mm or more and 0.2 mm or less. Then, the covering member 40 disposed between adjacent ones of the submount substrates 10 has a thickness of 0.05 mm or more and 0.2 mm or less. Accordingly, adjacent ones of the submount substrates 10 can be bonded to be close to each other. The covering member 40 disposed between adjacent ones of the submount substrates 10 can reduce the influence of thermal stress caused due to the difference of thermal expansion coefficient.

The first wiring portions 3 are disposed on an upper surface of the base portion 2 and are electrically connected to the light-emitting element 20 and the protective element 25. The second wiring portions 5 are disposed on a lower surface of the base portion 2 and electrically connected to an external power supply, serving as an external electrode for the light-emitting device 100. The inner wiring portions 4 are disposed inside the base portion 2 so as to penetrate the base portion 2, and electrically connect the first wiring portions 3 and the second wiring portions 5. The light-emitting device may not include the protective elements 25.

For example, a metal such as Fe, Cu, Ni, Al, Ag, Au, Pt, Ti, W, and Pd, or an alloy containing at least one of these metals can be used for each of the first wiring portions 3, the inner wiring portions 4, and the second wiring portions 5. The first wirings 3, the inner wiring portions 4, and the second wiring portions 5 can be formed by, for example, electroplating, electroless plating, vapor deposition, and sputtering.

The light-emitting element 20 is a semiconductor element that emit light when voltage is applied. An appropriate shape, size, and the like of the light-emitting element 20 can be selected. The emission color of the light-emitting element 20 can be selected from any appropriate wavelength according to the purpose. Examples of a blue light-emitting element 20 (light with wavelengths of 430 nm to 500 nm) and a green light-emitting element 20 (light with wavelengths of 500 nm to 570 nm) include a light-emitting element including a nitride semiconductor ($In_XAl_YGa_{1-X-Y}N$, where $0 \leq X$, $0 \leq Y$, and $X+Y \leq 1$), GaP, and the like. For a red light-emitting element 20 (light with wavelengths of 610 nm to 700 nm), a nitride semiconductor element, GaAlAs, AlInGaP, and the like can be used.

The light-emitting element 20 preferably has positive and negative element electrodes 23 on a single surface. This allows the light-emitting element 20 to be flip-chip mounted on the first wiring portions 3 of the submount substrate 10 using electroconductive adhesives. Examples of the electroconductive adhesive materials include eutectic solder, electroconductive paste, and bumps.

Examples of the protective element 25 include a Zener diode. The protective element 25 is provided with positive and negative element electrodes 27 on a surface of the protective element 25, and is flip-chip mounted on the first wiring portions 3 of the submount substrate 10 using the electroconductive adhesives.

The light-transmissive member 30 is made of, for example, resins, glass, or inorganic materials. The light-transmissive member 30 is disposed on the light-emitting element 20. The light-transmissive member 30 preferably has an upper surface that is larger than an upper surface of the light-emitting element 20.

In the light-emitting device 100, the distance between adjacent ones of the light-transmissive members 30 that are exposed on an upper surface of the light-emitting device 100 is preferably 0.2 mm or less. With the distance between the light-transmissive members 30 being 0.2 mm or less, for example, the light-emitting device 100 can serve as a compact light source for use in an adaptive driving beam (ADB) for vehicles, so that the size of the headlight lens can be decreased. Accordingly, a primary lens in optics can be omitted, and loss of light while passing through the headlight lens can be decreased. For further reduction in size of a light source, the distance between adjacent ones of the light-transmissive members 30 is more preferably 0.1 mm or less, further preferably 0.05 mm or less. For ease of manufacturing the light-emitting device 100, the distance between adjacent ones of the light-transmissive members 30 is preferably 0.03 mm or more.

The light-transmissive member 30 can have various planer shapes such as a circular shape, an elliptic shape, a square, or a polygonal shape such as a hexagonal shape. Among these shapes, the light-transmissive member 30 preferably has a rectangular shape such as a square shape or an elongated-rectangular shape, more preferably has a similar shape to the planer shape of the light-emitting element 20.

The light-transmissive member 30 can contain a wavelength conversion material. Examples of the wavelength conversion material include phosphors. Examples of the light-transmissive member 30 that contains phosphors include a sintered body of phosphors and a mixture of phosphor powder and other materials such as resins, glass, ceramics, and other inorganic substances. The light-transmissive member 30 can have a structure in which a resin layer containing a phosphor or a glass layer containing a phosphor is disposed on a surface of a molded body of a resin, a glass, or a ceramic. The light-transmissive member 30 can contain fillers such as diffusing materials depending on the purpose. In the case of containing fillers such as diffusing materials, an inorganic material such as resins, glass, ceramics, or the like that contains fillers can be used for the light-transmissive member 30. Alternatively, a structure in which a resin layer containing fillers or a glass layer containing fillers is disposed on a surface of a molded body of a resin, a glass, or a ceramic can be used for the light-transmissive member 30.

A phosphor known in the art can be used for the phosphor. Examples of green-light emitting phosphors include yttrium-aluminum-garnet based phosphors (for example, $Y_3(Al,Ga)_5O_{12}:Ce$), lutetium-aluminum-garnet based phosphors (for example, $Lu_3(Al,Ga)_5O_{12}:Ce$), terbium-aluminum-garnet based phosphors (for example, $Tb_3(Al,Ga)_5O_{12}:Ce$), silicate based phosphors (for example, $(Ba, Sr)_2SiO_4:Eu$), chlorosilicate based phosphors (for example, $Ca_8Mg(SiO_4)_4C_{12}:Eu$), β-SiAlON based phosphors (for example, $Si_{6-z}Al_zO_zN_{8-z}:Eu$ ($0 < z < 4.2$)), SGS based phosphors (for example, $SrGa_2S_4:Eu$). Examples of yellow-light emitting phosphors include α-SiAlON phosphors (for example, $Mz(Si,Al)_{12}(O,N)_{16}$ (where $0 < z \leq 2$, and M is Li, Mg, Ca, Y, or a lanthanoid element except for La and Ce). Some of the green-light emitting phosphors described above also emit yellow light.

Also, for example, yellow light can be obtained by substituting a part of Y in an yttrium-aluminum-garnet phosphor with Gd to shift its emission peak wavelength to a longer wavelength. Some of these phosphors can emit orange light. Examples of red-light emitting phosphors include nitrogen-containing calcium aluminosilicate based (CASN or SCASN) phosphors (for example, $(Sr,Ca)AlSiN_3:Eu$), and BSESN based phosphors (for example, $(Ba,Sr,Ca)_2Si_5N_8:Eu$). The examples of red-light emitting phosphors also include manganese-activated fluoride based phosphors (phosphors represented by the general formula (I) $A_2[M_{1-a}Mn_aF_6]$ (in the general formula (I), the symbol "A" is at least one selected from the group consisting of K, Li, Na, Rb, Cs, and $NH_4$, M is at least one element selected from the group consisting of the Group IV elements and the Group XIV elements, and the symbol "a" satisfies $0 < a < 0.2$)). Specific examples of the manganese-activated fluoride phosphors include manganese-activated potassium fluorosilicate phosphors (for example, $K_2SiF_6:Mn$).

A diffusing material known in the art can be used for the diffusing material. For example, barium titanate, titanium oxide, aluminum oxide, or silicon oxide can be used.

When using a resin for the light-transmissive member 30 or for a binder for phosphors and diffusing materials, examples of a material of the resin include thermosetting resins such as epoxy resins, modified epoxy resins, silicone resins, and modified silicone resins.

The covering member 40 is disposed to surround the plurality of first element structures 15. A resin material is preferably used for the covering member 40. The covering member 40 is, for example, made of a light-reflective resin containing the reflective material and covers lateral surfaces of the first element structures 15. That is, the covering member 40 covers lateral surfaces of each submount substrate 10, lateral surfaces of each light-emitting element 20, and lateral surfaces of each light-transmissive member 30. The covering member 40 is disposed between adjacent ones of the first element structures 15 to cover outer lateral surfaces of each of the first element structures 15. When the light-emitting device 100 includes the frame 50, the covering member 40 is disposed inward of the frame 50 between the frame 50 and the first element structures 15, and between the first element structures 15.

As shown in FIG. 1E, the covering member 40 covers portions of each of the first element structures 15, from the lateral surfaces of the light-transmissive member 30 to the lateral surfaces of the base portion 2 of the submount substrate 10, and the lateral surfaces and lower surfaces of the second wiring portions 5 are exposed from the covering member 40. The lower surface of the base portion 2 (that is, a surface of the base portion 2 opposite to a surface on which the light-emitting element 20 is disposed), the lateral surfaces of the second wiring portions 5, and the lower surfaces of the second wiring portions 5 are exposed from the covering member 40. The covering member 40 can cover the lateral surfaces of the second wiring portions 5 such that the lower surfaces of the second wiring portions 5 is exposed.

The covering member 40 cover at least a portion of the lateral surface of the submount substrate 10 of each of the first element structures 15. In view of reflection of light, the covering member 40 preferably covers at least upper half portions of the lateral surfaces of the submount substrate 10, more preferably covers the whole of the lateral surfaces of the submount substrate 10. In an example, the covering member 40 covers substantially the whole of the lateral surfaces of the submount substrate 10 and is disposed between the frame 50 and the submount substrate 10 to have an inclined surface.

Examples of resin materials for the covering member 40 include the resin materials described above as examples of a resin material for the light-transmissive member 30. Examples of light-reflective materials to be contained in the resin for the covering member 40 include titanium oxide, silica, silicon oxide, aluminum oxide, zirconium oxide, magnesium oxide, potassium titanate, zinc oxide, silicon nitride, and boron nitride. Among these materials, titanium oxide, which has a relatively high refractive index, is preferably used in view of reflection of light.

The frame member 50 surrounds the plurality of first element structures 15 and holds the covering member 40. The frame 50 has, for example, an elongated-rectangular shape in a plan view. The frame 50 surrounds the first element structures 15. The expression "the elongated-rectangular shape" of the frame 50 as used herein refers to an elongated-rectangular frame shape, that is, an elongated-rectangular annular shape. The frame 50 has a height from the light-emitting surface of the light-emitting device 100 to approximately the center of the base portion 2 of the submount substrate 10.

The frame 50 can be formed by a member having a frame shape and made of a metal, an alloy, or a ceramic. Examples of the metals include Fe, Cu, Ni, Al, Ag, Au, Pt, Ti, W, and Pd. Examples of the alloys include alloys containing at least one of Fe, Cu, Ni, Al, Ag, Au, Pt, Ti, W, Pd, and the like.

A resin material can be used for the frame. In this case, the member made of a metal, an alloy, or a ceramic described above can be embedded in the frame made of a resin material. Alternatively, the frame can have a portion made of a resin material and another portion made of a metal, an alloy, or a ceramic.

The light-emitting device 100 includes the plurality of first element structures 15. In the light-emitting device 100, a row of eleven first element structures 15 are held by the covering member 40. Meanwhile, the light-emitting device can include ten or less first element structures 15, or twelve or more first element structures 15.

Light-Emitting Module

Next, the light-emitting module 200 will be described below.

The light-emitting module 200 includes the light-emitting device 100 and the module substrate 80.

When the light-emitting device 100 does not include the protective element 25, it is preferable that the module substrate 80 includes the protective element 25. The module substrate 80 can include electronic components other than the protective element 25.

The light-emitting device 100 has the above-described configuration.

The module substrate 80 is a member on which the light-emitting device 100 is disposed, and electrically connects the light-emitting device 100 to external components. The module substrate 80 has, for example, a substantially elongated-rectangular shape in a plan view. The module substrate 80 includes a substrate portion 6 and third wiring portions 7.

Examples of materials for the substrate portion 6 include the materials listed as examples for the base portion 2 of the submount substrate 10. Examples of materials for the third wiring portions 7 include the materials listed as examples for the first wiring portions 3 of the submount substrate 10.

The light-emitting device 100 is disposed on an upper surface of the module substrate 80 such that the second wiring portions 5 and the third wiring portions 7 are joined via electroconductive adhesives 8. Examples of the electroconductive adhesives 8 include eutectic solder, electroconductive paste, and bumps. In the light-emitting module 200, the frame 50 has a height from the light-emitting surface of the light-emitting device 100 to approximately the center of the base portion 2 of the submount substrate 10. In the light-emitting module 200, the covering member 40 is formed between the frame 50 and the submount substrate 10 to have an inclined surface. This allows the light-emitting module 200 to have predetermined spaces between the module substrate 80 and the frame 50, and between the module substrate 80 and a surface of the covering member 40 between the frame 50 and the submount substrate 10.

Operation of Light-Emitting Module

When the light-emitting module 200 is driven, an electric current is supplied to each of the light-emitting elements 20 from an external power supply via the third wiring portions 7, the second wiring portions 5, the inner wiring portions 4, and the first wiring portions 3, so that the light-emitting element 20 emits light. A portion of the light emitted from the light-emitting elements 20 travels upward and is extracted to the outside toward above the light-emitting device 100 via the light-transmissive member 30. A portion of the light traveling downward is reflected at the covering member 40 and the submount substrate 10 and is extracted to the outside of the light-emitting device 100 via the light-transmissive member 30. A portion of the light traveling between the light-emitting elements 20 and the frame 50 is reflected at the covering member 40 and the frame 50 and is extracted to the outside of the light-emitting device 100 via the light-transmissive member 30. A portion of the light traveling between the light-emitting elements 20 is reflected at the covering member 40 and is extracted to the outside of the light-emitting device 100 via the light-transmissive member 30. In the case of using the light-emitting module 200 as a light source of a vehicle headlight, reduction of a distance between adjacent ones of the light-transmissive members 30 (for example, 0.2 mm or less) allows the optical system to have a simple and compact structure.

Method of Manufacturing According to Embodiment

FIG. 2 is a flowchart illustrating a method of manufacturing the light-emitting device according to the first embodiment. FIG. 3 is a flowchart illustrating a method of manufacturing the light-emitting module according to the first embodiment.

Method of Manufacturing Light-Emitting Device

One example of a method of manufacturing the light-emitting device 100 will be described.

The method of manufacturing the light-emitting device 100 includes: a step S101 of providing a plurality of first element structures 15 each of which includes a submount substrate 10, a light-emitting element 20, and a light-transmissive member 30 in this order; a step S102 of forming a frame to surround the first element structures 15 on a sheet member 70; a step S103 of disposing the first element structures 15 such that the light-transmissive members 30 face the sheet member 70; a step S104 of forming a covering member 40 on the sheet member 70 to cover at least a portion of a lateral surface of the submount substrate 10 of each of the first element structures 15; and a step S105 of removing the sheet member 70.

The step S101 of providing the first element structures includes a step S101a of providing a collective substrate 11 including a plurality of submount regions 12 each of which constitutes a respective one of the submount substrates 10 after the collective substrate 11 is divided, a step S101b of disposing the light-emitting elements 20 in the submount regions 12, a step S101c of disposing the light-transmissive members 30 on respective ones of light-emitting elements 20, and a step S101d of forming the plurality of first element structures 15 by dividing the collective substrate 11 for respective submount regions 12 into the first element structures 15.

The material, arrangement, and the like of each member are as described for the light-emitting device 100, and their duplicative descriptions are omitted as appropriate.

Providing First Element Structures

In the step S101 of providing the first element structures, the plurality of first element structures 15 are provided, each of which includes the submount substrate 10, the light-emitting element 20, and the light-transmissive member 30 in this order.

The step S101 includes the step S101a of providing a collective substrate, the step S101b of disposing light-emitting elements, the step S101c of disposing light-transmissive members, and the step S101d of forming first element structures.

Providing Collective Substrate

In the step S101a of providing the collective substrate, the collective substrate 11 is provided. The collective substrate 11 includes the plurality of submount regions 12, each of which constitutes the submount substrate 10 after the collective substrate 11 is divided.

The collective substrate 11 is a single substrate that includes the submount regions 12 on which light-emitting elements 20 are disposed. The collective substrate 11 shown in FIG. 4A includes four submount regions 12 for convenience; however, the number of the submount regions 12 can be appropriately selected.

Mounting Light-Emitting Elements

In the step S101b of disposing the light-emitting elements, the light-emitting elements 20 are disposed in the submount regions 12.

Figure 4A:
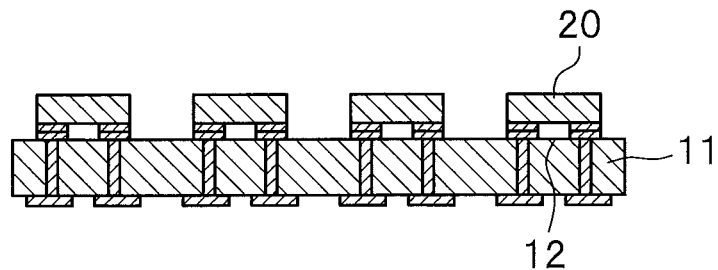
FIG. 4A is a schematic cross-sectional view illustrating mounting light-emitting elements in providing a first element structure in the method of manufacturing the light-emitting device according to the first embodiment.

In the step S101b, as shown in FIG. 4A, each of a plurality of light-emitting elements 20 is disposed on a respective one of the submount regions 12. The light-emitting elements 20 has an electrode forming surface as a mounting surface and is flip-chip mounted on first wiring portions that are disposed in the submount regions 12 via the electroconductive adhesives.

At this time, each of the protective elements 25 is disposed on a respective one of the submount regions 12.

Disposing Light-Transmissive Member

In the step S101c of disposing the light-transmissive members, each of the light-transmissive members 30 is disposed on a respective one of the light-emitting elements 20.

Figure 4B:
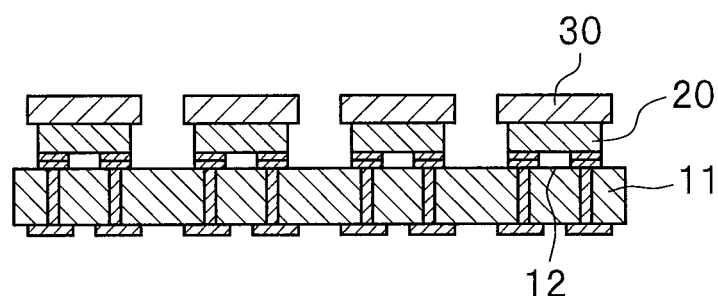
FIG. 4B is a schematic cross-sectional view illustrating disposing light-transmissive members in the providing the first element structure in the method of manufacturing the light-emitting device according to the first embodiment.

In the step S101c, as shown in FIG. 4B, for example, the light-transmissive member 30 that has a predetermined shape is joined to the upper surface of the light-emitting element 20 (that is, a main light extracting surface) that is opposite to the electrode forming surface. The light-transmissive member 30 can be joined to the light-emitting element 20 in a direct method or via a light-transmissive bonding member.

Forming First Element Structures

In the step S101d of forming the first element structures, the collective substrate 11 is divided for each submount region 12 to obtain the plurality of first element structures 15.

Figure 4C:
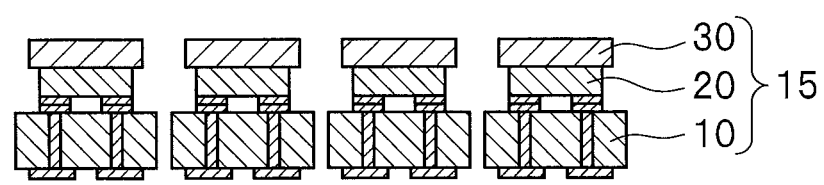
FIG. 4C is a schematic cross-sectional view illustrating forming the first element structures in the providing the first element structure in the method of manufacturing the light-emitting device according to the first embodiment.

In the step S101d, as shown in FIG. 4C, the collective substrate 11 is divided at predetermined positions to singulate into the plurality of first element structures 15.

The light-emitting device 100 is manufactured using a combination of the singulated first element structures 15. That is, selection of the first element structures 15 can be performed after the singulation into the first element structures 15, such that first element structures 15 having light-emitting characteristics in a predetermined range are selected from the singulated first element structures 15 and are a desired combination of the selected first element structures 15 is used for the light-emitting device 100. Accordingly, the light-emitting device 100 having a desired emission color with a smaller unevenness in emission color can be obtained.

Also, if a defect occurs in some of the first element structures 15 during manufacturing, only the defective first element structures 15 can be discarded before the first element structures 15 are disposed on the sheet member 70. In the case of a light-emitting device in which a plurality of light-emitting elements are disposed on a single submount substrate, if a defect occurs in some members, the whole light-emitting device needs to be discarded. The method of manufacturing the light-emitting device according to the embodiment can therefore reduce the number of members to be discarded if a defect is found during manufacturing.

Forming Frame

Figure 4D:
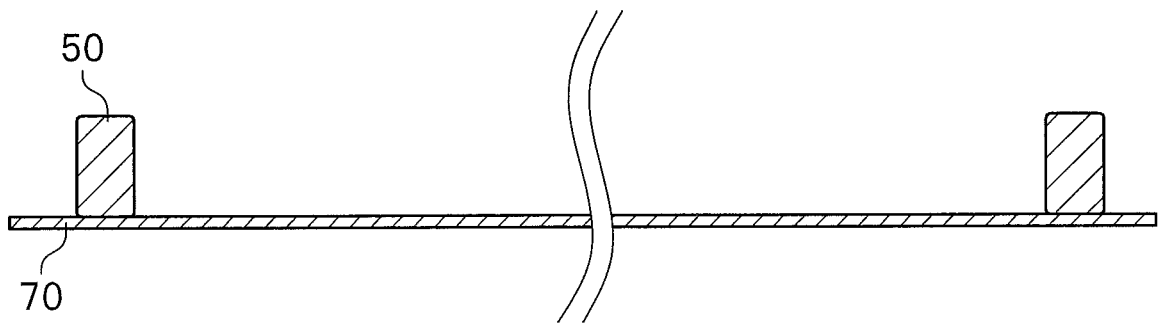
FIG. 4D is a schematic cross-sectional view illustrating forming a frame in the method of manufacturing the light-emitting device according to the first embodiment.

In the step S102 of forming the frame, as shown in FIG. 4D, the frame 50 is formed on the sheet member 70 to surround the plurality of first element structures 15.

The frame 50 can be formed at a desired position on the sheet member 70 using, for example, a frame-shaped member made of metals, alloys, or ceramics.

Using metals, alloys, or ceramics for the frame 50 allows for reducing warpage of the covering member 40. This allows the light-emitting device 100 to have a flat mounting surface. In the case of using resin materials for the covering member 40, warpage may occur in the light-emitting device 100 due to shrinkage of the resin while the resin is cured. However, the warpage can be reduced by using a non-flexible material for the frame 50. This allows the light-emitting device 100 to have a good mountability on the module substrate 80.

Further, the frame 50 can be formed before the step S103 of disposing the first element structures. This allows the first element structures 15 to be disposed on the sheet member 70 on the basis of the position of the frame 50. Accordingly, the first element structures 15 can be precisely disposed on the sheet member 70 without alignment marks for disposing the first element structures 15.

Mounting First Element Structure

In the step S103 of disposing the first element structures, the plurality of first element structures 15 are disposed such that the light-transmissive members 30 face the sheet member 70. That is, the first element structures 15 are disposed on the sheet member 70 such that upper surfaces of the light-transmissive members 30 (that is, surfaces opposite to the surfaces on which the light-emitting elements 20 are disposed) face an upper surface of the sheet member 70. After the singulation, the singulated first element structures 15 are disposed on the sheet member 70. For example, when a blade is used for the singulation, the first element structures 15 are disposed with a smaller distance between adjacent one of the first element structures 15 than the width of the blade. This allows the light-emitting device 100 to have small intervals between adjacent ones of the light-emitting surfaces.

Figure 4E:
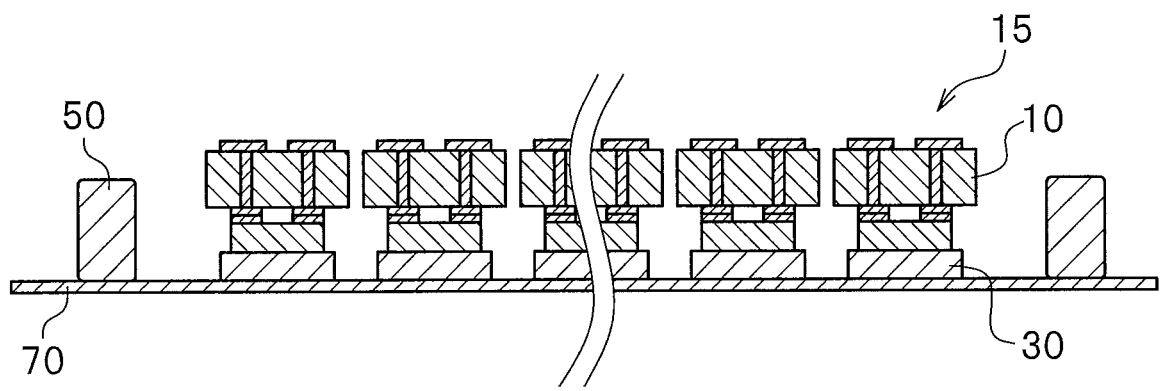
FIG. 4E is a schematic cross-sectional view illustrating mounting the first element structures in the method of manufacturing the light-emitting device according to the first embodiment.
Figure 4F:
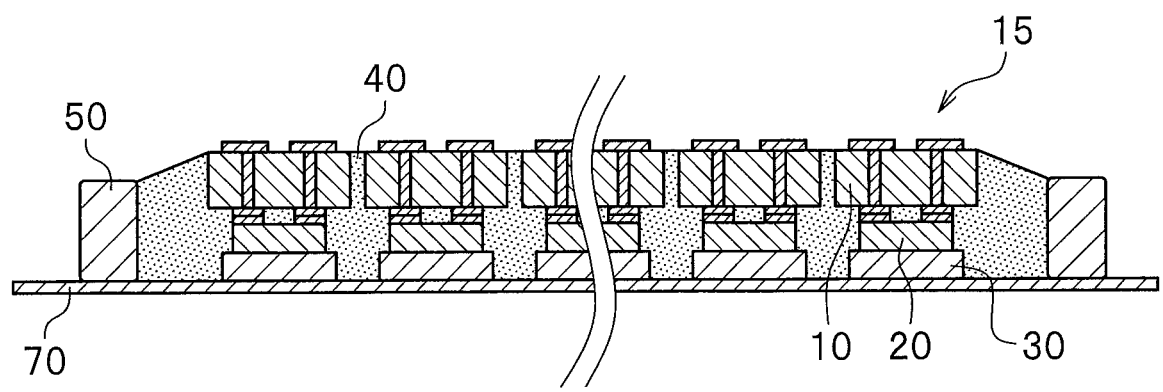
FIG. 4F is a schematic cross-sectional view illustrating forming a covering member in the method of manufacturing the light-emitting device according to the first embodiment.
Figure 4G:
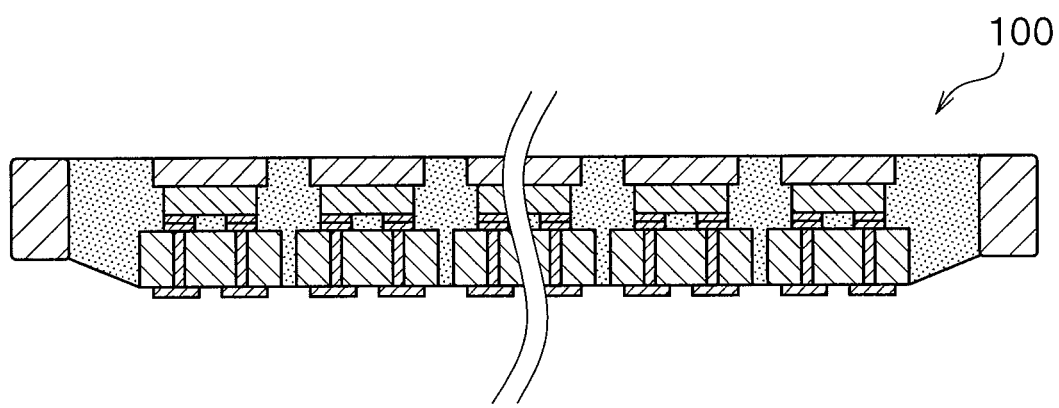
FIG. 4G is a schematic cross-sectional view illustrating removing a sheet member in the method of manufacturing the light-emitting device according to the first embodiment.
Figure 4H:
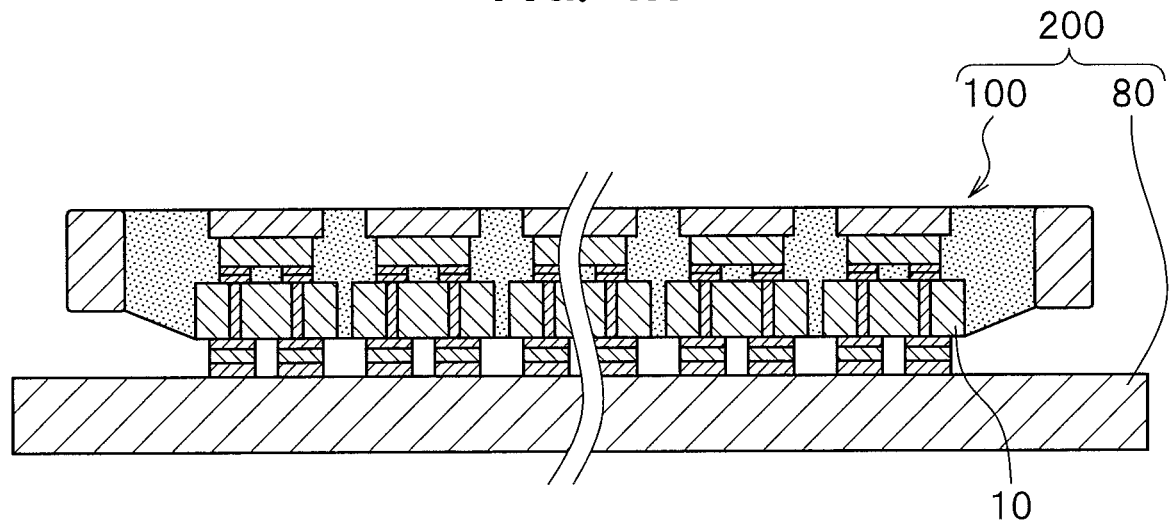
FIG. 4H is a schematic cross-sectional view illustrating disposing the light-emitting device in the method of manufacturing the light-emitting module according to the first embodiment.
Figure 4I:
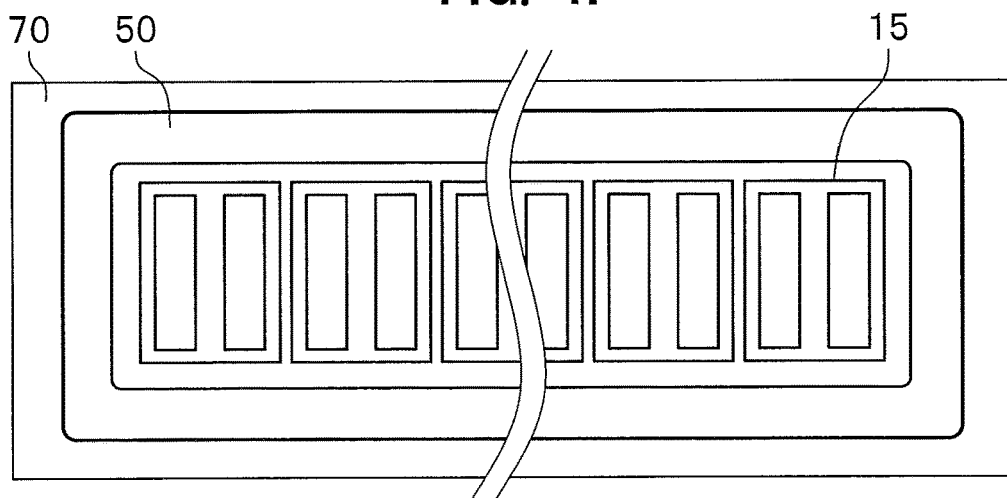
FIG. 4I is a schematic plan view illustrating the mounting the first element structure in the method of manufacturing the light-emitting device according to the first embodiment.

In the step S103, as shown in FIGS. 4E and 4I, the first element structures 15 are disposed on the upper surface of the sheet member 70. The first element structures 15 are disposed on the upper surface of the sheet member 70 such that the upper surfaces of the light-transmissive members 30 serve as mounting surfaces.

Examples of the sheet member 70 known in the art include heat-resistant resin sheets.

Disposing the first element structures 15 such that the tipper surface of each light-transmissive member 30 faces the sheet member 70 allows the plurality of light-emitting surfaces of the light-emitting device 100 to be located at a uniform height.

Forming Covering Member

In the step S104 of forming the covering member, the covering member 40 is formed on the sheet member 70 to cover at least a portion of the lateral surface of the submount substrate 10 of each of the first element structures 15.

Figure 4J:
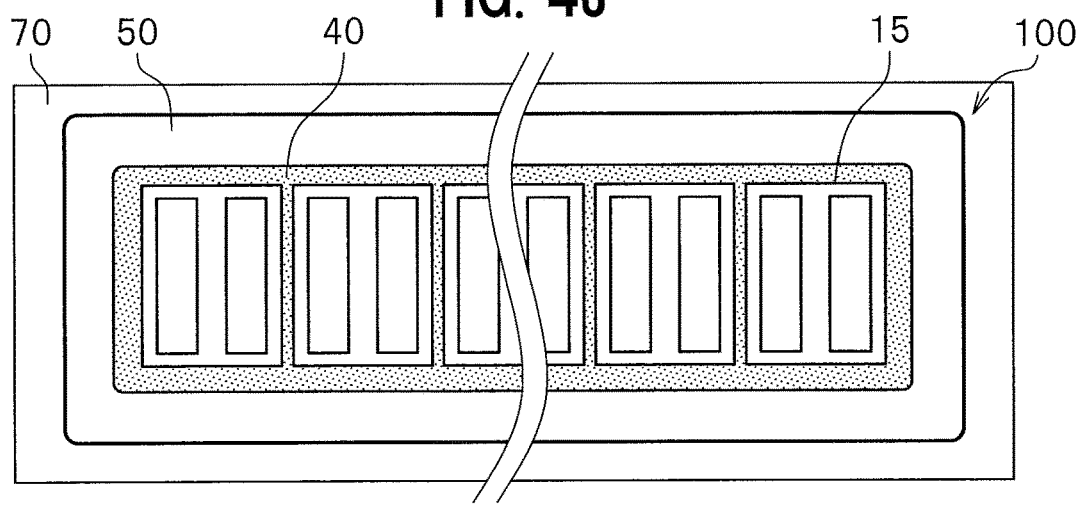
FIG. 4J is a schematic plan view illustrating forming the covering member in the method of manufacturing the light-emitting device according to the first embodiment.

In the step S104, as shown in FIGS. 4F and 4J, the covering member 40 is formed inside the frame 50 such that the covering member 40 covers at least a portion of the lateral surface of the submount substrate 10 of the first element structure 15.

In the step S104, an uncured resin material, which constitutes the covering member 40, is disposed between the frame 50 and the first element structures 15, and between adjacent ones of the first element structures 15, by, for example, potting or spraying. Thereafter, the resin material is cured to form the covering member 40.

In the step S104, the covering member 40 is disposed to cover the lateral surfaces of the first element structure 15 (that is, the lateral surfaces of the submount substrate 10, the lateral surfaces of the light-emitting element 20, and the lateral surfaces of the light-transmissive member 30) except a lower surface of the submount substrate 10. The lateral surfaces of the second wiring portion 5 are not covered with the covering member 40. The covering member 40 can be disposed to cover the lower surface of the submount substrate 10, and then a portion of the covering member 40 can be removed by polishing, grinding, cutting, or the like, to expose the lower surface of the submount substrate 10, that is, the lower surface of the second wiring portion 5.

The covering member 40 is formed in a state where each of the first element structures 15 is disposed such that the upper surface of the light-transmissive member 30 faces the sheet member 70. This allows the plurality of light-emitting surfaces in the light-emitting device 100 and the upper surface of the covering member 40 between adjacent ones of the light-emitting surfaces to be substantially in the same plane.

Removing Sheet Member

In the step S105 of removing the sheet member, the sheet member 70 is removed.

In the step S105, as shown in FIG. 4G, the sheet member 70 on which the first element structures 15 and the like are disposed is peeled off to form the light-emitting device 100.

The light-emitting device 100 obtained as described above has small intervals between adjacent ones of the light-emitting surfaces, and the light-emitting surfaces are located at substantially uniform height. This allows light distribution to be easily adjusted by the optics such as lenses.

Method of Manufacturing Light-Emitting Module

Next, an example of a method of manufacturing the light-emitting module 200 will be described.

The method of manufacturing the light-emitting module 200 includes a step S11 of providing the light-emitting device 100 using the method of manufacturing the light-emitting device 100, and a step S12 of disposing the light-emitting device 100 such that the submount substrates 10 face the module substrate 80.

The material, arrangement, and the like of each member are as described for the light-emitting module 200, and their duplicative descriptions are omitted as appropriate.

Providing Light-Emitting Device

In the step S11 of providing the light-emitting device, the light-emitting device 100 is provided using the method of manufacturing the light-emitting device 100 described above.

In the step S11, the steps S101 to S105 described above are performed to manufacture the light-emitting device 100.

Mounting Light-Emitting Device

In the step S12 of disposing the light-emitting device, the light-emitting device 100 is disposed such that the submount substrates 10 face the module substrate 80.

Figure 4K:
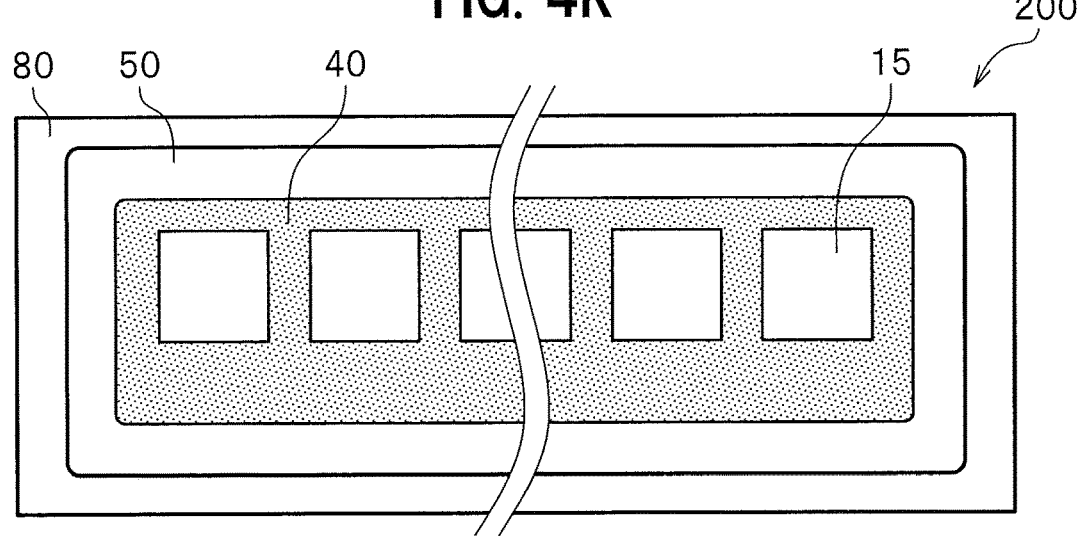
FIG. 4K is a schematic plan view illustrating mounting the light-emitting device in the method of manufacturing the light-emitting module according to the first embodiment.

In the step S12, as shown in FIGS. 4H and 4K, the light-emitting device 100 is disposed on the upper surface of the module substrate 80. The light-emitting device 100 has a mounting surface at the submount substrate 10 side, and is mounted on the upper surface of the module substrate 80 via the electroconductive adhesives 8.

An upper surface of the frame 50 is located between the light-emitting surface of the light-emitting device 100 and an approximate center of the base portion 2 of the submount substrate 10 in a height direction. Accordingly, upon disposing the light-emitting device 100 on the module substrate 80, it is not necessary to consider adjustment of the height by adjusting the amount of the electroconductive adhesives 8, which would be considered in the case in which the frame 50 is brought into contact with the upper surface of the module substrate 80. Accordingly, the light-emitting device 100 is easily disposed on the upper surface of the module substrate 80.

While certain embodiments of the method of manufacturing the light-emitting device, the method of manufacturing the light-emitting module, the light-emitting device, and the light-emitting module have been specifically described, the spirit of the present invention is not limited to these descriptions and should be broadly interpreted on the basis of the claims. The spirit of the present invention also encompasses various modifications based on these descriptions.

Other Embodiments

Figure 5A:
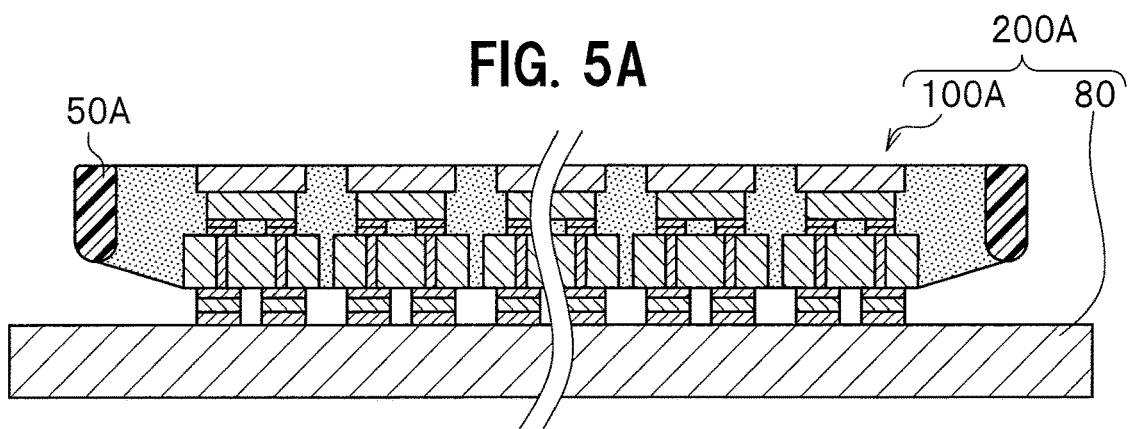
FIG. 5A is a cross-sectional view schematically illustrating the structure of a light-emitting module including a light-emitting device according to another embodiment 1.

As shown in FIG. 5A, a light-emitting module 200A and a light-emitting device 100A include a frame 50A that is made of a resin containing a reflective material.

Examples of the resin material for the frame 50A include the resin materials described above as examples of the resin material for the light-transmissive member 30. Examples of the reflective material to be contained in the resin for the frame 50A include the reflective materials described above as examples of the reflective material to be contained in the resin for the covering member 40.

The frame 50A can be disposed at desired positions on the sheet member 70 using, for example, a discharging device (i.e., a resin discharging device) that can continuously discharge a liquid resin using air pressure (for example, see Japanese Unexamined Patent Application Publication No. 2009-182307).

Alternatively, a resin molded body that has been processed to have a frame shape can be provided as the frame 50A and disposed at a desired position on the sheet member 70.

Figure 5B:
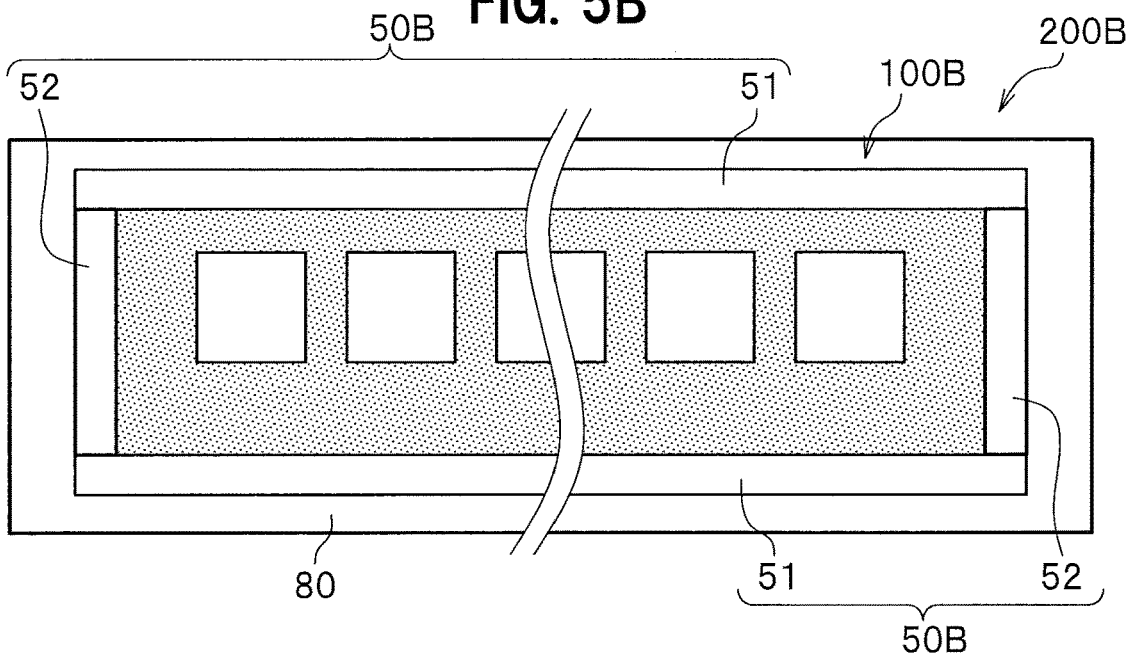
FIG. 5B is a plan view schematically illustrating the structure of a light-emitting module including a light-emitting device according to another embodiment 2.

As shown in FIG. 5B, a light-emitting module 200B and a light-emitting device 100B include a frame 50B that has a substantially elongated-rectangular shape in a plan view and is made of a plurality of different materials. The frame 50B has an elongated-rectangular frame shape with two long sides and two short sides. The two long sides are formed by bar members 51 made of a material having rigidity higher than rigidity of the covering member 40. The two short sides are formed by resin members 52 made of a resin containing a reflective material. Specific examples of the bar member 51 include metals, alloys, and ceramics.

The frame 50B can be formed, for example, by disposing the bar member 51 in a region of the long side of the elongated-rectangular shape and disposing the resin member 52 in a region of the short side of the elongated-rectangular shape. The bar member 51 can be disposed only at one of the long sides of the elongated-rectangular shape.

Figure 5C:
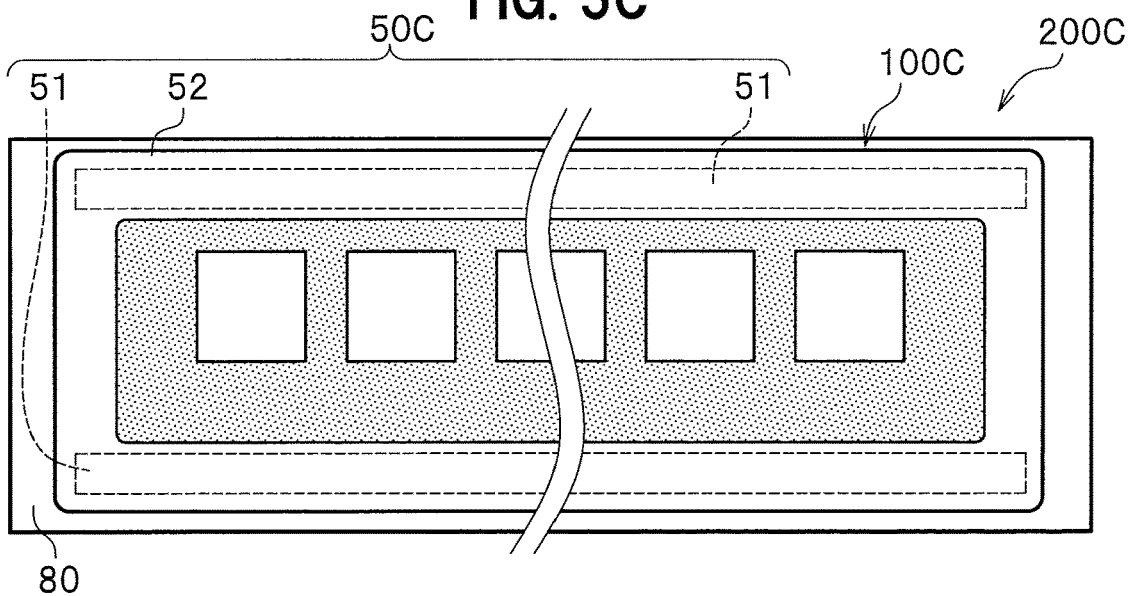
FIG. 5C is a plan view schematically illustrating the structure of a light-emitting module including a light-emitting device according to another embodiment 3.

As shown in FIG. 5C, a light-emitting module 200C and a light-emitting device 100C include a frame 50C that has a substantially elongated-rectangular frame shape in a plan view. Two long sides of the elongated-rectangular frame shape contain metals, alloys, or ceramics. Each of the two long sides is a bar member 51 made of a material having rigidity higher than rigidity of the covering member 40. A resin member 52 that is made of a resin containing a reflective material and has an elongated-rectangular shape is disposed to cover the bar member 51.

Figure 5D:
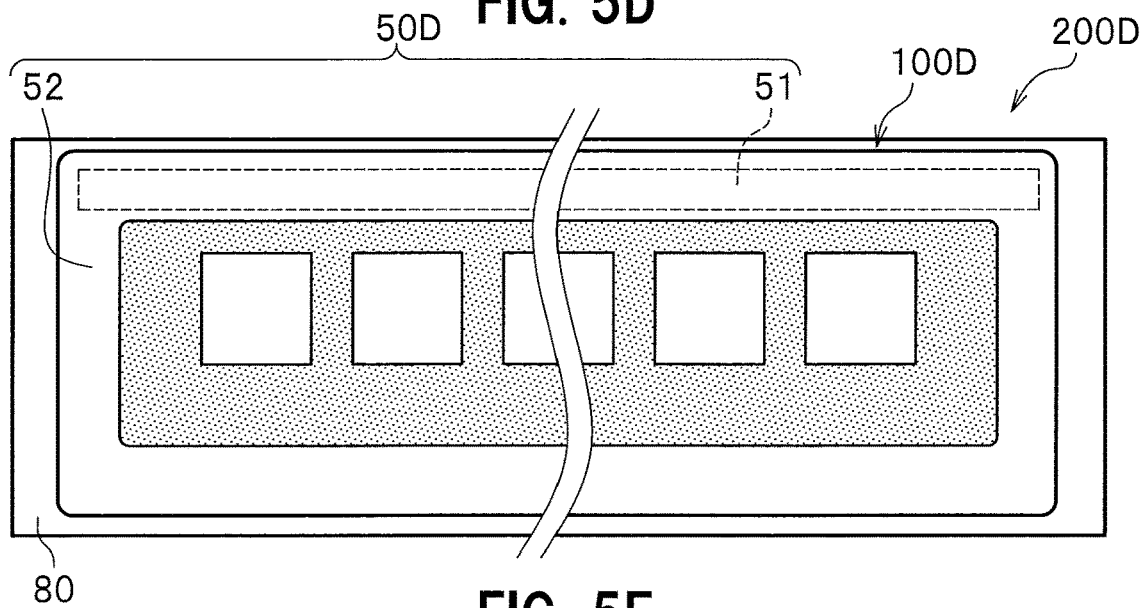
FIG. 5D is a plan view schematically illustrating the structure of a light-emitting module including a light-emitting device according to another embodiment 4.

As shown in FIG. 5D, a light-emitting module 200D and a light-emitting device 100D include a frame 50D including the bar member 51 disposed only at one of the long sides of the elongated-rectangular frame shape. Other portions are the same as the light-emitting module 200C and the light-emitting device 100C.

Using the bar member(s) 51 for a portion(s) of the frame in the light-emitting device allows for reducing warpage of the covering member 40 that occurs when the covering member 40 is cured.

Figure 5E:
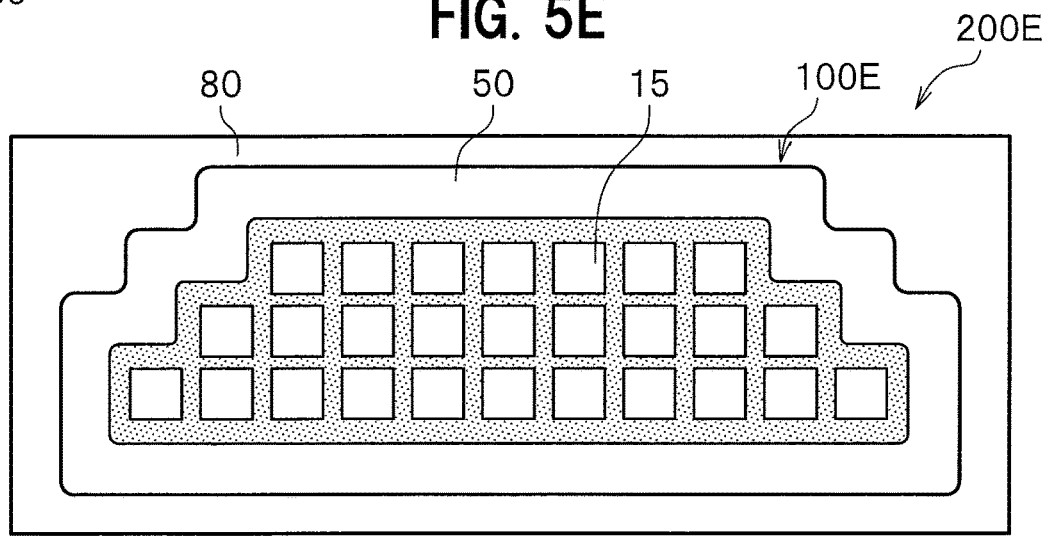
FIG. 5E is a plan view schematically illustrating the structure of a light-emitting module including a light-emitting device according to another embodiment 5.

As shown in FIG. 5E, a light-emitting module 200E and a light-emitting device 100E include the plurality of first element structures 15 disposed in a matrix. The first element structures 15 in this example are disposed in three rows, such that seven first element structures 15 are arranged in a first row, nine first element structures 15 are arranged in a second row, and eleven first element structures 15 are arranged in a third row, that is, twenty-seven first element structures 15 in total are disposed.

Figure 5F:
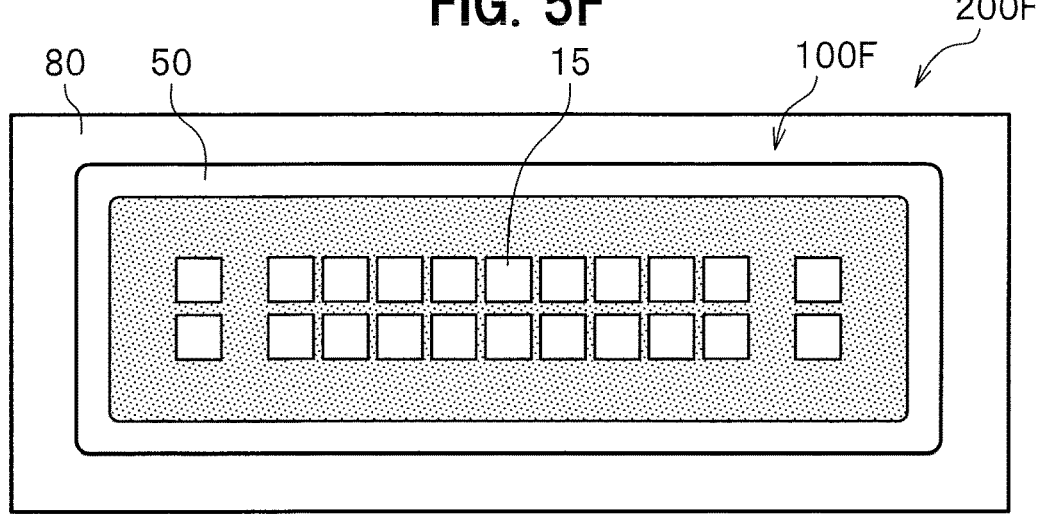
FIG. 5F is a plan view schematically illustrating the structure of a light-emitting module including a light-emitting device according to another embodiment 6.

As shown in FIG. 5F, a light-emitting module 200F and a light-emitting device 100F include the plurality of first element structures 15 disposed in a matrix of two rows and eleven columns. Each of outermost first element structures 15 of each row of the first element structures 15 is located at a distance from a respective adjacent first element structure 15 in the row direction greater than a distance between two adjacent ones of the other first element structures 15 in the row direction.

Figure 5G:
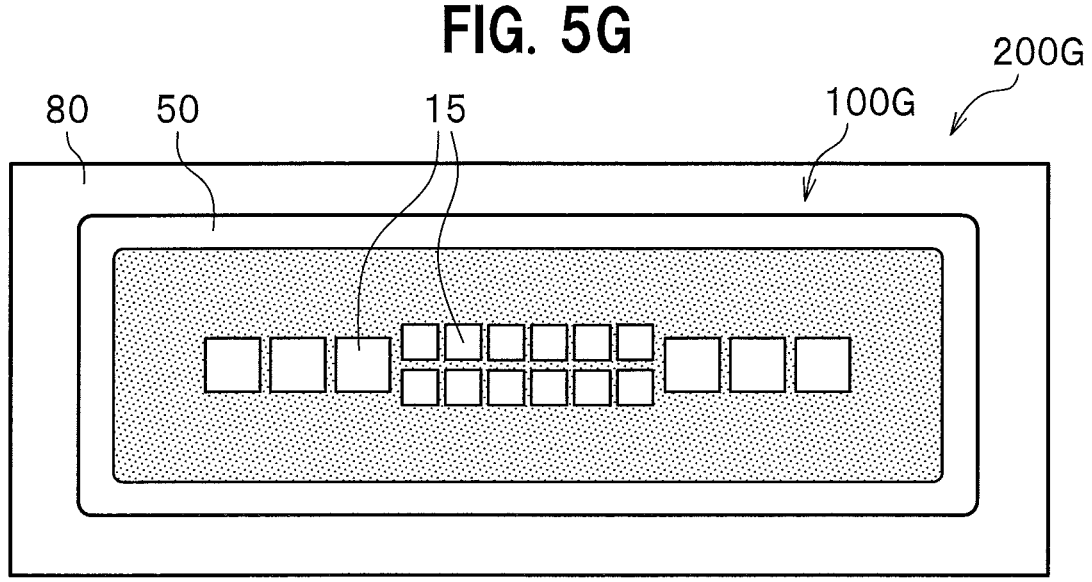
FIG. 5G is a plan view schematically illustrating the structure of a light-emitting module including a light-emitting device according to another embodiment 7.

As shown in FIG. 5G, a light-emitting module 200G and a light-emitting device 100G include a combination of first element structures 15 that have the light-emitting surfaces in different sizes. In FIG. 5G, the first element structures 15 having light-emitting surfaces of a smaller size are disposed at the central region of the light-emitting device 100G in a matrix of two rows and six columns. Further, three first element structures 15 having light-emitting surfaces of a larger size are disposed at each of two opposite ends in the row direction of the matrix of the first element structures 15 having light-emitting surfaces of a smaller size. In the light-emitting module 200G and the light-emitting device 100G, arranging the first element structures 15 having smaller light-emitting surfaces at the central region allows the first element structures 15 to be more densely disposed compared with the case in which the first element structures 15 having larger light-emitting surfaces are disposed at the central region. With the dense arrangement of the first element structures 15 at the central region in the light-emitting device 100G included in the light-emitting module 200G, for example, in the case of using the light-emitting module 200G for a light source of a vehicle headlight, a central area (mainly on a road) can be more finely irradiated.

Figure 5H:
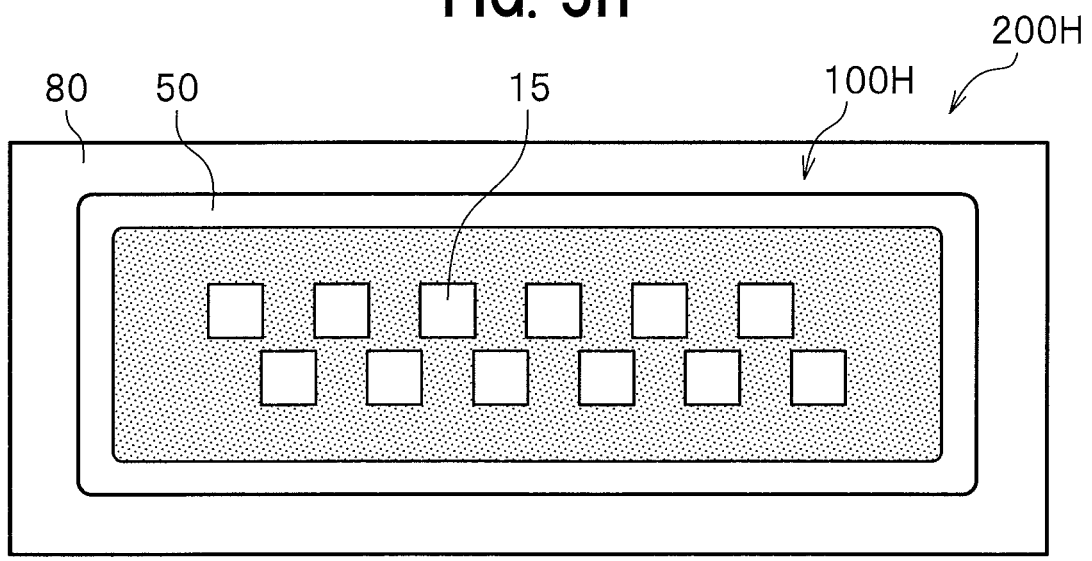
FIG. 5H is a plan view schematically illustrating the structure of a light-emitting module including a light-emitting device according to another embodiment 8.

As shown in FIG. 5H, a light-emitting module 200H and a light-emitting device 100H include the plurality of first element structures 15 disposed in two alternate rows. In FIG. 5H, the first element structures 15 in a first row are offset from the first element structures 15 in a second row in the row direction so that a gap between each first element structure 15 in the first row and a respective first element structure 15 in the second row is 0 or less in the row direction. With the first element structures 15 that can be disposed with a gap of 0 or less in the row direction in the light-emitting device 100H included in the light-emitting module 200H, for example, in the case of using the light-emitting module 200H for a light source of a vehicle headlight, a lateral side can be more finely irradiated.

As described above, in the light-emitting module and the light-emitting device, any appropriate number of rows and columns of the first element structures 15 can be employed. The number of the first element structures 15 in each row and each column can be appropriately selected according to the desired light distribution pattern. In the light-emitting module and the light-emitting device, the combination of the first element structures 15 having the light-emitting surfaces in different sizes and the layout of the first element structures 15 can be appropriately selected according to the desired light-distribution pattern.

Figure 6A:
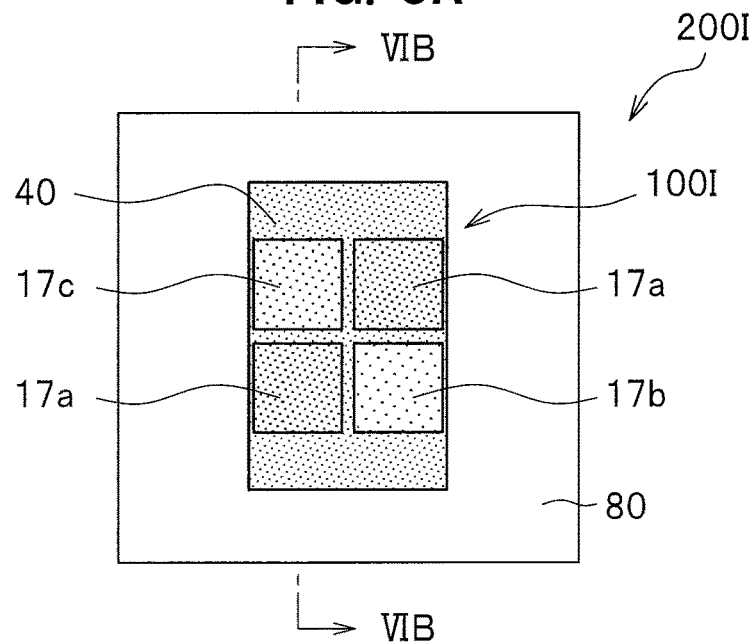
FIG. 6A is a plan view schematically illustrating the structure of a light-emitting module including a light-emitting device according to another embodiment 9.
Figure 6B:
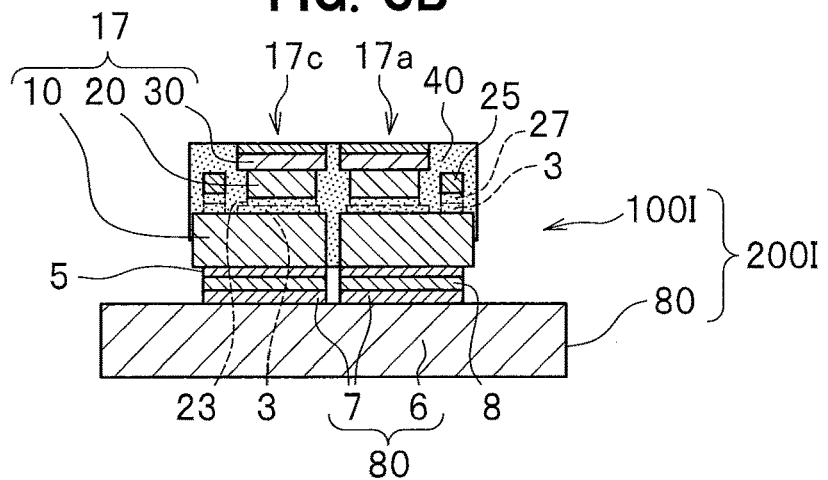
FIG. 6B is a schematic sectional view taken along line VIB-VIB of FIG. 6A.
Figure 6C:
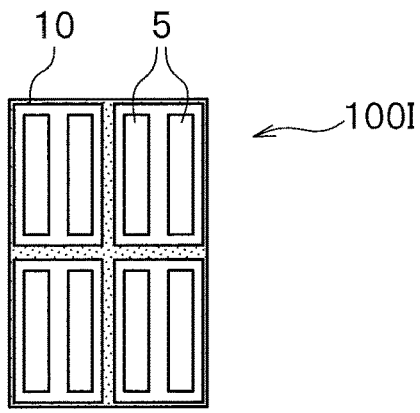
FIG. 6C is a schematic bottom view illustrating the structure of the light-emitting device according to the another embodiment 9 shown in FIG. 6A.

As shown in FIG. 6A, a light-emitting module 200I includes a light-emitting device 100I and the module substrate 80.

The light-emitting device 100I includes a plurality of second element structures 17 each of which includes the submount substrate 10, the light-emitting element 20, and the light-transmissive member 30 that are layered in this order and the covering member 40 that covers lateral surfaces of each of the second element structures 17 to hold the second element structures 17. Each of the second element structures 17 includes the protective element 25.

In short, the light-emitting device 100I mainly includes submount substrates 10, light-emitting elements 20, protective elements 25, light-transmissive members 30, and the covering member 40.

The second element structures 17 include a red element structure 17a that emits red light, a blue element structure 17b that emits blue light, and a green element structure 17c that emits green light. The second element structures 17 are disposed in two rows and two columns. Two red element structures 17a are disposed diagonally, and the blue element structure 17b and the green element structure 17c are disposed diagonally.

Each of the second element structures 17 is arranged such that the protective element 25 is located outer side of the light-emitting device 100I. This allows four light-transmissive members 30 to be disposed in a matrix with smaller intervals.

The red-light emitting element structure 17a includes, for example, a blue light-emitting element 20 and a light-transmissive member 30 containing a red phosphor. The blue-light emitting element structure 17b includes, for example, a blue light-emitting element 20 and a light-transmissive member 30 containing a diffusing material. The green-light emitting element structure 17c includes, for example, a green light-emitting element 20 and a light-transmissive member 30 containing a diffusing material. Alternatively, the green-light emitting element structure 17c includes, for example, a blue light-emitting element 20 and a light-transmissive member 30 containing a green phosphor.

The light-transmissive member 30 containing a red phosphor or a green phosphor can be formed of a glass plate on which a resin layer containing a phosphor or a glass layer containing a phosphor is formed. The light-transmissive member 30 containing a diffusing material can be formed of a glass plate on which a resin layer containing a diffusing material or a glass layer containing a diffusing material is formed.

In the case of combining a plurality of element structures having different emission colors into the second element structures 17, with the element structures disposed at approximately the same height, creeping up of the covering member 40 to the upper surface of the submount substrate 10 can be reduced. In each of the element structures, the amount of phosphors required to obtain a desired emission color can be different, and the thickness of the resin layer can be different depending on the presence or absence of the phosphors. These differences can be adjusted by adjusting the thickness of the glass plate.

The light-emitting module 200I includes the above-described light-emitting device 100I disposed on the module substrate 80.

Other configurations are the same as in the light-emitting module 200 and the light-emitting device 100 in the first embodiment.

The light-emitting device can include one red-light emitting element structure 17a, one blue-light emitting element structure 17b, and one green-light emitting element structure 17c. In the light-emitting device, the red-light emitting element structure 17a, the blue-light emitting element structure 17b, and the green-light emitting element structure 17c can be alternately disposed in a single line, or in a matrix. The light-emitting device can include an element structure that emits white light and an element structure that emits amber light. The light-emitting device can include element structures each emitting light having various emission colors obtained by selecting the wavelength of the light-emitting element 20 and the type and the ratio of phosphors contained in the light-transmissive member 30. The element structures can be disposed in a desired combination.

The light-emitting device and the light-emitting module described above may or may not include the frame. When the light-emitting device and the light-emitting module include the frame, the frame can be disposed intermittently along an outer periphery of the light-emitting device. The frame can have a height from the light-emitting surface of the light-emitting device to the second wiring portions of the submount substrate 10. In this case, in the light-emitting module, the frame can be joined to the module substrate via an electroconductive adhesive. This allows heat generated by the light-emitting device to be dissipated to the module substrate via the frame. Accordingly, the light-emitting module has a good heat dissipation. The frame can be joined to the module substrate via a nonconductive adhesive, or can be disposed on the module substrate without adhesives.

The submount substrate and the module substrate can have a substantially square shape in a plan view. The frame can have a substantially square shape in a plan view. The submount substrate, the module substrate, and the frame can have other shapes.

The method of manufacturing the light-emitting device and the method of manufacturing the light-emitting module can include another step between the steps or before or after the steps, as long as the additional step does not adversely affect the other steps. For example, a foreign matter removal step of removing foreign matters mixed during manufacturing can be included.

In the step of providing the first element structures described above, each of the plurality of light-emitting elements 20 are disposed on a respective one of the submount substrates 10, and thereafter the light-transmissive members 30 are disposed on the respective light-emitting elements 20. The light-transmissive members 30 can be disposed on the light-emitting elements, and thereafter the light-emitting elements 20 can be disposed on the submount substrates 10. Also, the light-emitting elements 20 and the light-transmissive members 30 can be disposed on the submount substrates 10 after the collective substrate 11 is divided.

In the method of manufacturing the light-emitting device and the method of manufacturing the light-emitting module, the order of some steps is not limited but can be changed. For example, in the above-described method of manufacturing the light-emitting device, the step of forming the frame is performed before the step of disposing the first element structures. However, the step of forming the frame can be performed after the step of disposing the first element structures and before the step of forming the covering member. Further, the step of forming the frame can be performed after a step of mounting the second element structures, or before the step of forming the covering member. Furthermore, the step of forming the frame can be performed before the step of providing the first element structures.

The light-emitting device and the light-emitting module according to the embodiments of the present disclosure can be used for a light source of an Adaptive Driving Beam (ADB) type headlight. Other applications of the light-emitting device and the light-emitting module according to the embodiments of the present disclosure include light sources for backlights of liquid-crystal displays, a variety of lighting apparatuses, large format displays, and various displays for advertisements or destination guides, as well as digital video cameras, image scanners in apparatuses such as facsimile machines, copying machines, and scanners, projectors, and other apparatuses.

While certain embodiments of the method of manufacturing the light-emitting device, the method of manufacturing the light-emitting module, the light-emitting device, and the light-emitting module have been specifically described, the spirit of the present invention is not limited to these descriptions and should be broadly interpreted on the basis of the claims. The spirit of the present invention also encompasses various modifications based on these descriptions.

What is claimed is:

1. A light emitting device comprising:
a plurality of element structures, each of the plurality of element structures comprises a light emitting element;
a frame surrounding the plurality of element structures; and
a covering member disposed on an inner side of the frame, the covering member is disposed between the frame and an element structure of the plurality of element structures adjacent to the frame and between adjacent element structures of the plurality of element structures,
wherein an upper surface and a lower surface of each of the plurality of element structures are exposed from the covering member,
wherein a lowest surface of the frame is exposed, and
wherein the upper surface of each of the plurality of element structures is coplanar with an upper surface of the covering member and an upper surface a the frame.

2. The light emitting device according to claim 1,
wherein the covering member has a portion located lower than the lowest surface of the frame in a height direction.

3. The light emitting device according to claim 1,
wherein the light emitting device has a rectangular shape that is elongated in a first direction in a plan view, and
wherein the plurality of element structures are aligned in the first direction in the plan view.

4. The light emitting device according to claim 3,
wherein, in the plan view, a center of each of the plurality of element structures is disposed offset in a second direction orthogonal to the first direction with respect, to a center axis of the rectangular shape in the first direction.

5. The light emitting device according to claim 4,
wherein each of the plurality of element structures further includes a protective element, and wherein the protective element is disposed alongside a respective light emitting element in the second direction in the plan view.

6. The light emitting device according to claim 3,
wherein each of the plurality of clement structures includes a pair of wiring portions on the lower surface of the element structure, and
wherein the pair of wiring portions are disposed adjacent to each other in the first direction in the plan view.

7. The light emitting device according to claim 1.
wherein a distance between the adjacent element structures that are located on an upper surface of the light emitting device is 0.2 mm or less.

8. The light emitting device according to claim 1,
wherein the covering member has an inclined surface between the frame and the element structure adjacent to the frame.

9. The light emitting device according to claim 1,
wherein each of the plurality of element structures further includes a light-transmissive member disposed above the light emitting element, and
wherein the light-transmissive member constitutes the upper surface of the element structure.

10. The light emitting device according to claim 1,
wherein each of the plurality of element structures further includes a submount substrate disposed below the light emitting element, and
wherein the submount substrate constitutes the lower surface of the element structure.

11. The light emitting device according to claim 1,
wherein each of the plurality of element structures further includes a submount substrate disposed below the light emitting element, and
wherein the submount substrate constitutes the lower surface of the element structure.

12. The light emitting device according to claim 1,
wherein the plurality of element structures includes a first element structure that emits white light and a second element structure that emits amber light.

13. The light emitting device according to claim 1,
wherein the frame is made of metals, alloys, or ceramics.

14. The light emitting device according to claim 1,
wherein the covering member is a light-reflective resin.

15. A light emitting module comprising:
a module substrate; and
the light emitting device according to claim 1, the light emitting device is disposed on an upper surface of the module substrate.

16. The light emitting module according to claim 15,
wherein the frame is separated from the module substrate in a height direction.

17. The light emitting module according to claim 15,
wherein the covering member is separated from the module substrate in a height direction.

18. The light emitting module according to claim 15,
wherein each of the plurality of element structures further includes a light-transmissive member disposed above the light emitting element,
wherein the light-transmissive member constitutes the upper surface of the element structure,
wherein each of the plurality of element structures further includes a submount substrate disposed below the light emitting element, and
wherein the submount substrate constitutes the lower surface of the element structure.

19. A light emitting device comprising:
a plurality of element structures, each of the plurality of element structures comprises a light emitting element;
a frame surrounding the plurality of element structures; and
a covering member disposed on an inner side of the frame, the covering member is disposed between the Frame and an element structure of the plurality of element structures adjacent to the frame and between adjacent element structures of the plurality of element structures,
wherein an upper surface and a lower surface of each of the plurality of element structures are exposed from the covering member,
wherein a lowest surface of the frame is exposed, and
wherein the covering member has a portion located lower than the lowest surface of the frame in a height direction.

20. A light emitting device comprising:
a plurality of element structures, each of the plurality of element structures comprises a light emitting element;
a frame surrounding the plurality of element structures; and
a covering member disposed on an inner side of the frame, the covering member is disposed between the frame and an element structure of the plurality of element structures adjacent to the frame and between adjacent element structures of the plurality of element structures,
wherein an upper surface and a lower surface of each of the plurality of element structures are exposed from the covering member,
wherein a lowest surface of the frame is exposed,
wherein the light emitting device has a rectangular shape that is elongated in a first direction in a plan view,
wherein the plurality of element structures are aligned in the first direction in the plan view, and
wherein, in the plan view, a center of each of the plurality of element structures is disposed offset in a second direction orthogonal to the first direction with respect to a center axis of the rectangular shape in the first direction.

* * * * *